United States Patent [19]

Tsukamoto et al.

[11] Patent Number: 5,028,560
[45] Date of Patent: Jul. 2, 1991

[54] METHOD FOR FORMING A THIN LAYER ON A SEMICONDUCTOR SUBSTRATE

[75] Inventors: Katsuhiro Tsukamoto; Akira Tokui, both of Hyogo, Japan

[73] Assignee: Mitsubishi Denki Kabushiki Kaisha, Tokyo, Japan

[21] Appl. No.: 317,710

[22] Filed: Mar. 1, 1989

[30] Foreign Application Priority Data

Jun. 21, 1988 [JP] Japan .................. 63-154118

[51] Int. Cl.⁵ ........................................ H01L 21/20
[52] U.S. Cl. ........................... 437/81; 148/DIG. 17; 437/173; 437/939; 437/946; 437/239
[58] Field of Search ...................... 148/17, 21, 22, 24, 148/25, 97, 127; 156/610-614; 427/248.1, 255.1, 53.1, 54.1; 437/81, 82, 105, 106, 107, 108, 111, 126, 131, 132, 133, 247, 939, 173, 9391942, 946, 239, 237

[56] References Cited

U.S. PATENT DOCUMENTS

| | | | |
|---|---|---|---|
| 3,773,578 | 11/1973 | Glendinning et al. | 437/946 |
| 3,949,119 | 4/1976 | Shewchun et al. | 437/106 |
| 3,969,164 | 7/1976 | Cho et al. | 156/610 |
| 4,115,163 | 9/1978 | Gorina et al. | 156/610 |
| 4,226,667 | 10/1980 | Logan | 156/656 |
| 4,292,093 | 9/1981 | Ounby et al. | 427/53.1 |
| 4,361,461 | 11/1982 | Chang | 156/659.1 |
| 4,421,576 | 12/1983 | Jolly | 156/613 |
| 4,477,311 | 10/1984 | Mimura et al. | 156/643 |
| 4,560,576 | 12/1985 | Lewis et al. | 427/38 |
| 4,579,609 | 4/1986 | Reif et al. | 156/612 |
| 4,585,517 | 4/1986 | Stemple | 156/643 |
| 4,590,091 | 5/1986 | Rogers, Jr. et al. | 427/53.1 |
| 4,595,601 | 6/1986 | Horioka et al. | 437/239 |
| 4,655,849 | 4/1987 | Schacharmeyer et al. | 427/53.1 |

FOREIGN PATENT DOCUMENTS

| | | | |
|---|---|---|---|
| 0105334 | 8/1980 | Japan | 437/239 |
| 0018437 | 2/1981 | Japan | 437/946 |
| 0006692 | 2/1982 | Japan | 437/946 |
| 0075629 | 4/1984 | Japan | 437/239 |
| 0036936 | 2/1986 | Japan | 437/239 |
| 0276325 | 12/1986 | Japan | 437/946 |
| 0210627 | 9/1987 | Japan | 437/946 |
| 0272540 | 11/1987 | Japan | 437/239 |
| 0129633 | 6/1988 | Japan | 437/946 |
| 2111037 | 6/1983 | United Kingdom | 437/239 |

OTHER PUBLICATIONS

Takamori et al., "Cleaning of MBE GaAs Substrates by Hydrogen ... ", Jpn. J. Applied Phys., vol. 26, No. 2, Feb. 1987, pp. 2142-2144.

R. Sugino et al., "Through-Oxide Cleaning of Silicon Surface by Photo-Excited Radicals", Extended Abstracts of the 19th Conf. on Solid State Devices and Materials, Tokyo 1987.

E. Kinsbron et al., "Crystallization of Amorphous Silicon Films During Low Pressure Chemical Vapor Deposition", Appl. Phys. Lett., vol. 42, No. 9 (May 1, 1983).

Primary Examiner—Olik Chaudhuri
Assistant Examiner—William D. Bunch
Attorney, Agent, or Firm—Lowe, Price, LeBlanc and Becker

[57] ABSTRACT

A method and apparatus for manufacturing a semiconductor device having a thin layer of material formed on a semiconductor substrate with a much improved interface between them are disclosed. A silicon substrate is heated up to a temperature around 300° C. in the presence of ozone gas under exposure to UV light. Through this process, organic contaminants that might be present on the surface of the silicon substrate are dissipated by oxidation, and a thin oxide film is formed on the substrate surface on the other. The silicon substrate with the thin oxide film coated thereon is then heated up to temperature of 200°-700° C. in the presence of HCl gas under illumination to UV light to strip the oxide film off the substrate surface, thereby exposing the cleaned substrate surface. Finally, HCl cleaned surface of the silicon substrate is coated with a thin layer of material such as monocrystalline silicon without exposing the cleaned substrate surface. The method provides a semiconductor device with the thin layer of material formed thereon having a well-controlled, well-organized interface between them.

9 Claims, 10 Drawing Sheets

METHOD FOR FORMING A THIN LAYER ON A SEMICONDUCTOR SUBSTRATE

BACKGROUND OF THE INVENTION

1. Field of the Invention

This invention relates to a method for forming a thin layer of material on the surface of a semiconductor substrate and an apparatus for the same. In particular, this invention relates to a novel method for forming a thin layer of material on the surface of a semiconductor substrate after the substrate surface has been cleared of unwanted organic contaminants, metal contaminants and damaged surface, and without exposing the cleaned substrate surface to the ambient air, and an apparatus for carrying out the method.

2. Description of the Background Art

Performance characteristics of electronics devices are readily and adversely affected by contaminants introduced on purpose or by accident in the course of the manufacturing process. In order to avoid any introduction of contaminants into the electronics products as much as possible, it is necessary to keep the whole manufacturing environment at a maximum possible degree of cleanness. In this connection, highly advanced cleaning and purifying technologies are employed to produce desired starting materials and processing environments for the manufacture of the devices.

The manufacturing process for semiconductor devices is roughly divided into a thin film formation and a circuit pattern formation. The process for forming thin films or layers of material on the semiconductor substrate is further divided into many subprocesses depending on the material of which the thin films are made and techniques to be used to form them. Various cleaning technologies for each of the subprocesses or to be shared by some of the subprocesses have been developed into practical use. Important and essential to all these subprocesses is the pretreatment of the semiconductor substrate which is performed prior to forming the thin films on the substrate.

In the pretreatment process, the semiconductor substrate is cleaned with water, acid or alkalis or it is subjected to chemical oxidation or treatment with diluted hydrofluoric acid solution for the removal of grease, heavy metals, naturally grown oxide film and the like. These solution cleaning techniques are widely used in the industry but are disadvantageous in that the cleaned semiconductor substrate is unavoidably exposed to the surrounding air before it is coated with thin films in a subsequent process. The exposure to the air causes a thin oxide film to grown on the substrate surface, especially when the substrate contains active semiconductor substance or it has exposed metal portions thereon. For this reason, the substrate cleaning with solutions falls short of complete cleaning of the substrate surface although it is effective to remove heavy metal and organic contaminants.

The growth of a natural oxide film on the semiconductor substrate has an adverse effect on the quality of various thin films to be formed on the substrate in subsequent steps. The thin films provided on the semiconductor substrate includes epitaxially grown layers, layers of high melting point metals or polysilicide layers, electrical interconnection layers, ultra-thin insulating layers. The formation of these layers on the semiconductor substrate is gaining a growing importance as the integration of semiconductor devices advances.

Figure 11:
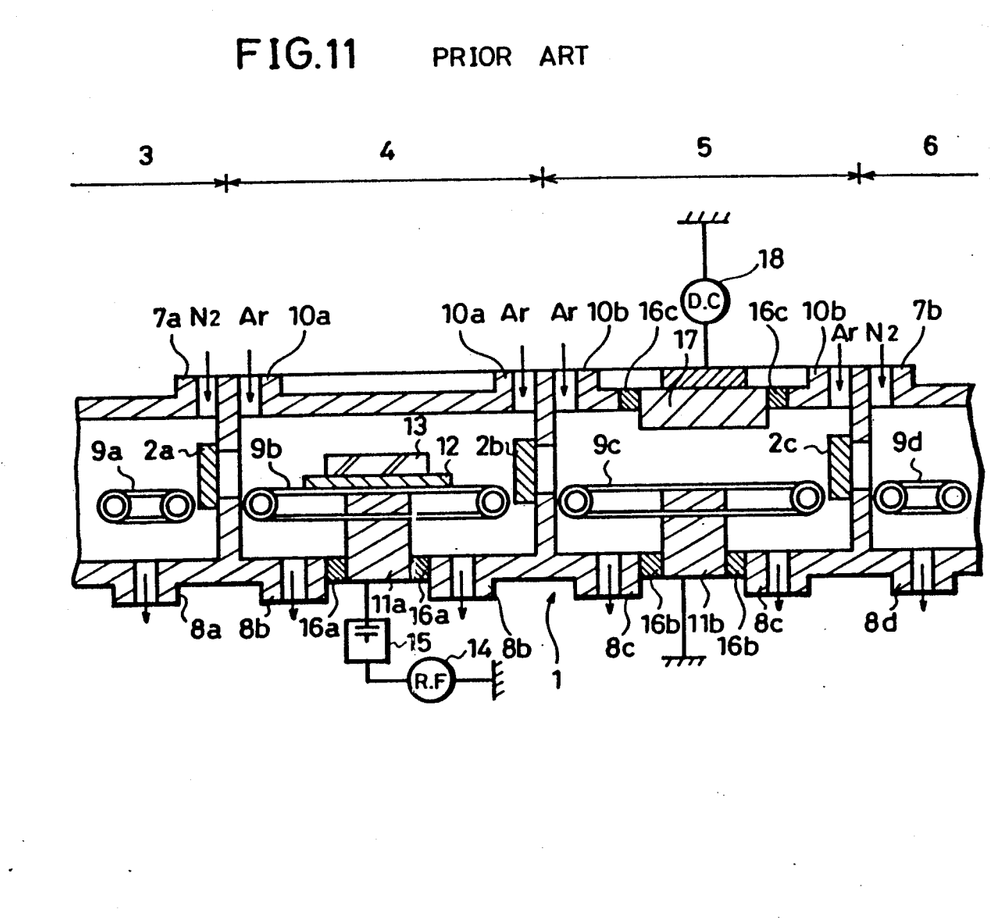
FIG. 11 is a cross-sectional view of a prior-art apparatus for forming a thin layer of material on a semiconductor substrate.

In order to have a brief background understanding, references is made to FIG. 11 which illustrates a prior-art apparatus for sputter-forming thin layer on a semiconductor substrate. As shown, the apparatus includes a chamber 1 which are divided by partition walls into a loading compartment 3, and an etching compartment 4, a depositing compartment 5 and an unloading compartment 6. The partition walls are provided with passage openings to be covered with lock valves 2a, 2b and 2c, respectively.

The loading compartment 3 is equipped with an inlet 7a for nitrogen gas, and an exhaust outlet 8. Provided within the loading compartment 3 is a belt conveyer 9a as transport means.

The etching compartment 4 is equipped with an inlet 10a for argon gas and an exhaust outlet 8b. Housed within the etching compartment 4 are a belt conveyer 9b and a substrate support 11a with a tray 12 for accommodating a semiconductor substrate attached thereto. The substrate support 11a is coupled to a radio frequency source 14 through a matching circuit 15, and is electrically insulated from the chamber 1 by an insulation 16a.

The depositing compartment 5 is also provided with an inlet 10a for argon gas and an exhaust outlet 8c. Housed within the depositing compartment are a belt conveyer 9c, a substrate support 11b and a target 17. The target 17 is connected to a DC source 18 which applies a high potential voltage across the target 17 and the argon gas atmosphere within the depositing compartment. An insulation 16b electrically separates the substrate support 11b from the chamber 1, and another insulation 16c provides an electrical insulation between the target 17 and the chamber 1.

The unloading compartment 6 is equipped with an inlet 7b for nitrogen gas, and an exhaust outlet 8d. It also houses a conveyer belt 9d.

With the apparatus, a thin layer of material is formed on the semiconductor substrate as follows.

All of the loading compartment 3, etching compartment 4, depositing compartment 5 and unloading compartment 6 in the chamber 1 are first kept in a high-intensity vacuum state. Then nitrogen gas is introduced into the loading compartment 3 via the gas inlet 7a thereby to attain the atmospheric pressure within the loading compartment. A plurality of silicon substrates are carried into the loading compartment through an entry opening (not shown), after which the entrance opening is closed with a cover lid (not shown). It should be noted that the silicon substrate has been cleaned with a solution but has already an oxide film grown on its surface. The loading compartment 3 is exhausted through the outlet 8a using a vacuum pump (not shown) thereby to produce a high-intensity vacuum within the compartment. With the loading compartment in this high vacuum state, the lock valve 2a is swung open and the tray 12 carrying the silicon substrates is transferred through the passage opening in the partition into the neighboring etching compartment 4 by means of the belt conveyer 9a. Thereafter, the lock valve 2a is moved back to its passage closing position. The operations of both the belt conveyer 9a and the movable lock valve 2a are controlled by suitable externally provided control unit such as a switching unit. As stated above, the etching compartment 4 is kept at a high vacuum of $10^{-7}$-$10^{31\ 8}$ Torr. With the silicon substrate 13 on the tray 12 placed on the support 11a, an argon gas is introduced into the deposit compartment at $10^{-3}$–$10^{-1}$ Torr, followed by switching the RF source 14 into operation. As the RF source 14 is turned on, it applies a high potential of several hundred to several thousand volts across the silicon substrate 13 and the argon atmosphere within the compartment to produce an argon plasma. Excited argon ions in the plasma bombard the silicon substrate kept at a negative potential. The bombarding argon ions act to sputter-etch the naturally grown oxide film of the surfaces of the silicon substrate 13. Upon the complete removal of the oxide film, the supply of the argon gas and the high potential are both discontinued. The remaining argon gas is expelled out of the etching compartment 4 to keep the compartment in a high vacuum state. Under the conditions, the lock valve 2b is swung open to allow the substrate carrying tray 12 to be transported into the deposit compartment 5 by the belt conveyer 9b. At about the same time, a second tray with a plurality of silicon substrate is carried into the etching compartment 4. The deposit compartment 5 has also been maintained at a high vacuum of $10^{-7}$–$10^{-8}$ Torr. Now argon gas is introduced into deposit compartment at $10^{-3}$–$10^{-1}$ Torr through the inlet 10b. Then the DC power supply 18 is turned on to apply a potential of several hundred to several thousand volts across the target 17 and the argon gas in the compartment, thereby creating argon plasma. Highly excited argon ions in the plasma bombard the target 17 which is kept at a negative potential and strike atoms off the surface of the target. As a result of the process, a thin layer having a uniform and homogeneous quality is deposited on the surface of the silicon substrate. As the deposited layer grows to a desired thickness, the supply of the argon gas as well as the high potential voltage is discontinued. Then, the deposit compartment 5 is again exhausted to a high vacuum state.

The lock valve 2c is moved to an open position and the belt conveyer 9c carries the tray 12 with the silicon substrate 13 into the unloading compartment 6. Thereafter, the lock valve 2c is swung back to the closed position. At about the same time, the second tray is brought into the deposit compartment 5, while a third tray into the etching compartment 4. In this manner, the trays with silicon substrates are moved through the etching and deposit compartment into the unloading compartment 6 one after another. In the unloading compartment 6, the silicon substrate 13 on each tray are loaded off into a container (not shown). When the silicon substrates on all of the trays have been loaded into the container, the unloading compartment 6 is restored to the atmospheric pressure and the substrate-filled container is carried out of the unloading compartment to a next process location.

As has been stated hereinabove, with the arrangement of the conventional apparatus, it is necessary to apply a high potential voltage between the silicon substrate and the argon gas in order to remove the naturally grown oxide film from the substrate surface. However, the argon plasma generated by the high potential tends to cause damage on the surface of the silicon substrates.

It has also been proposed to gas-etch the natural oxide film on a semiconductor substrate through high temperature hydrogen reduction technique, followed by forming thin layers of desired metals. But the hydrogen reduction process exposes the semiconductor substrate to elevated temperatures normally above 1,000° C., causing thermal fusion at the PN junction. This in turn limits the application of the hydrogen reduction technique.

SUMMARY OF THE INVENTION

This invention has been made to overcome the above-stated drawbacks of the prior-art, and it is an object of the invention to provide a method and apparatus for forming a thin layer of material on a semiconductor substrate without exposing to the surrounding atmosphere immediately after the removal of undesired organic contaminants and a naturally grown oxide film from the substrate surface at relatively low temperatures without relying on solvent cleaning and without causing damage to the substrate surface.

The present inventors have long been engaged in the research on forming thin layers of material on the surface of a semiconductor substrate. We also have made research into the method for removing organic contaminants from the surface of a semiconductor substrate. As a result of our continued efforts, we have discovered that when the semiconductor substrate is heated in the presence of oxidizing gas under exposure to light, the organic contaminants on the substrate surface are disintegrated and dissipated and, at the same time, a very thin film of oxide naturally grows on the cleaned substrate surface, and that the naturally grown oxide film can be removed by heating the substrate in the presence of an etching gas under exposure to light. The discoveries have lead to the present invention. The invention is directed to a method for removing organic contaminants and the like from the surface of a semiconductor substrate and for forming a thin layer of material on the cleaned substrate surface. The method of the invention includes the steps of: preparing a semiconductor substrate; growing a thin layer of oxide by heating the semiconductor substrate in the presence of oxidizing gas and under exposure to light while removing organic contaminants on the substrate surface in the process; exposing an underlying cleaned surface of the semiconductor substrate by removing the oxide film on the substrate surface; and forming a thin layer of material on the exposed clean surface of the substrate without exposing it to the ambient air. Oxidizing gases suitable for use in the invention are $O_3$, $O_2$, $N_2O$, and $NF_3$.

According to the invention, the oxide film on the semiconductor substrate may be removed by heating the substrate in the presence of an etching gas and under exposure to light. With this procedure, the oxide film is stripped at relatively lowered temperatures without causing any damage to the substrate surface. The gas for etching the oxide film preferably includes hydrogen chloride gas, chlorine gas and hydrogen gas.

The thin film may be formed on the cleaned surface of the substrate by any suitable process but the chemical vapor deposition and sputter deposition are preferred.

Any suitable thin layer of substance may be formed by means of CVD. Preferred CVD layers may include: a silicon layer such as monocrystalline silicon layer, a polycrystalline silicon layer; an insulating layer such as a silicon nitride layer and a silicon oxide layer; a layer of high melting point metal such as tungsten, molybdenum, tantalum and titanium; and a layer of a silicide compounds of the stated high melting point metals.

Any suitable thin layer of material may be formed by sputter-deposition and it may includes electrically conductive as well as insulating layers.

In order to etch the oxide film, the semiconductor substrate may preferably be heated up to temperatures between 200°-700° C. As will be discussed in detail below based on pertinent data, at temperatures below 200° C., the oxide film is removed from the substrate surface at too slow a rate, while a temperatures above 700° C., the oxide film is etched first enough but only at the expense of causing the thermal fusion of the types stated previously.

In a preferred embodiment of the invention, the step of etching the oxide layer involves carrying a semiconductor substrate into a first chamber and filling the first chamber with a gas for etching the oxide film. The step of forming a thin film of material on a semiconductor substrate involves carrying the semiconductor substrate from the first chamber into a second chamber, and filling the second chamber with a gas suitable for forming the thin film. In the embodiment, a third chamber which is exhausted of the air may optionally be provided between the first and second chamber. The semiconductor substrate which has gone through the oxide film removal in the first chamber is brought into the third chamber before it is moved on into the second chamber for the formation of the thin layer.

In another embodiment, the step of etching the oxide layer away from a semiconductor substrate involves carrying the semiconductor substrate into a chamber and filling the chamber with a gaseous atmosphere suitable for etching the oxide film. The step of forming a thin layer of material involves replacing the etching gas atmosphere in the chamber with a gaseous atmosphere suitable for forming the thin layer of material.

Light used in the present invention may preferably be UV light emitted from a low-pressure mercury lamp, high high-pressure mercury lamp, a mercury-xenon lamp and an excimer laser source. An apparatus for forming a thin layer of material includes; a chamber for accommodating a semiconductor substrate; means for growing an oxide layer on the surface of the semiconductor substrate which is placed in the chamber; means for stripping the oxide layer of the substrate surface; and means for forming a thin layer of material on the substrate surface which has been cleaned of the oxide film. Means for growing the oxide layer on the substrate surface includes for introducing oxidizing gas into the chamber, a first heating means for heating the semiconductor substrate placed in the chamber, and a first light means for radiating light rays to the surface of the semiconductor substrate.

Means for stripping the oxide film according to the invention preferably includes means for introducing into the chamber a gas for etching the oxide film, a second means for heating the semiconductor substrate within the chamber, and a second light means for radiating light rays for the surface of the semiconductor substrate.

Any suitable means may be employed for forming a thin layer of material. Chemical vapor deposition means and sputter deposition means are preferred for the purpose.

In an apparatus according to another embodiment of the invention, the chamber has a compartment for forming an oxide layer, a compartment for removing the oxide layer, and a compartment for forming a thin layer of material. Means for forming an oxide layer is provided in the oxide forming compartment, means for removing the oxide layer is provided in the oxide removing compartment, and means for forming a thin layer of material is provided in the layer forming compartment. The apparatus also has conveyer means for carrying the semiconductor substrate successively through these three compartments. The apparatus may preferably be provided with an auxiliary and intermediate compartment between the oxide removing compartment and the layer forming compartment through which the semiconductor substrate is carried from the oxide removing compartment and to a layer forming compartment by conveyer means.

An apparatus according to another embodiment of the invention includes a chamber which comprises a front compartment and a rear compartment. The front compartment is provided with means for forming the oxide layer, while the rear compartment with the means for removing the oxide layer as well as the means for forming the thin layer of material. The apparatus itself is equipped with a conveyer for carrying the semiconductor substrate from the front compartment to the rear compartment. The means for removing the oxide film includes means for introducing into a rear compartment a gas suitable to etch away the oxide film, a second means for heating the semiconductor substrate placed in the rear compartment, and a second light means for radiating light rays toward the surface of the semiconductor substrate. The means for forming the thin layer of material includes means for sputtering particles out of a target onto semiconductor substrate to form a thin layer thereon. The rear compartment is equipped with a substrate carrier for moving the semiconductor substrate within the rear compartment. The substrate carrier moves the semiconductor substrate to a position where the substrate surface faces the second light means when the oxide layer on the substrate surface is to be removed, and to a position where the substrate surface faces the target when the thin layer is to be formed on the substrate surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The operative feature of the invention is briefly described with reference to FIGS. 1A–1D.

According to the invention, a semiconductor substrate 13 such as a silicon substrate is placed in an oxidizing gas atmosphere and under exposure to UV light, thereby to induce a photo-chemical reaction on the surface of the semiconductor substrate. As the result of the photo-chemical reaction, unwanted organic contaminants 20 on the substrate surface are disintegrated and removed on one hand (FIG. 1A), and a thin oxide film 21 is grown on the substrate surface (FIG. 1B) on the other. The oxide film effectively contains an undesired metal layer and damaged surface layer.

Figure 1A:
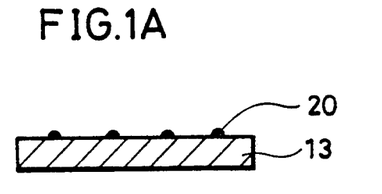
FIGS. 1A-1D are sectional views of a semiconductor substrate in successive steps in a method according to the invention.
Figure 1B:
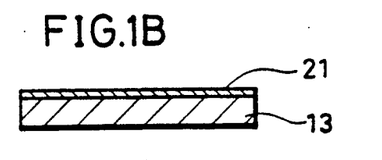
Figure 1C:
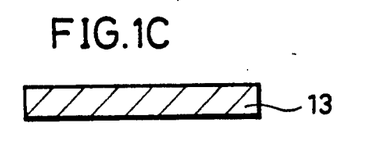
Figure 1D:
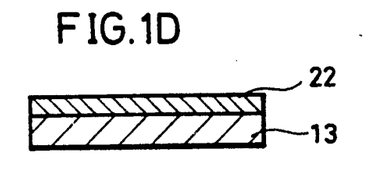

Thereafter, as shown in FIG. 1C, the oxide-clad silicon substrate 13 is subjected to hydrogen chloride gas or chlorine gas under UV ray radiation, thereby eliminating the oxide film 21 on the substrate surface, and exposing the cleaned substrate surface. The silicon substrate 13 is next coated with a thin layer of material over its cleaned surface by chemical vapor deposition or CVD without being exposed to the ambient air. The interface between the substrate 13 and the thin layer 22 in the resultant semiconductor device is free of undesirable organic contaminants, naturally grown oxide, metal layer or damage layer i.e. the interface is well controlled and conditioned.

Figure 2:
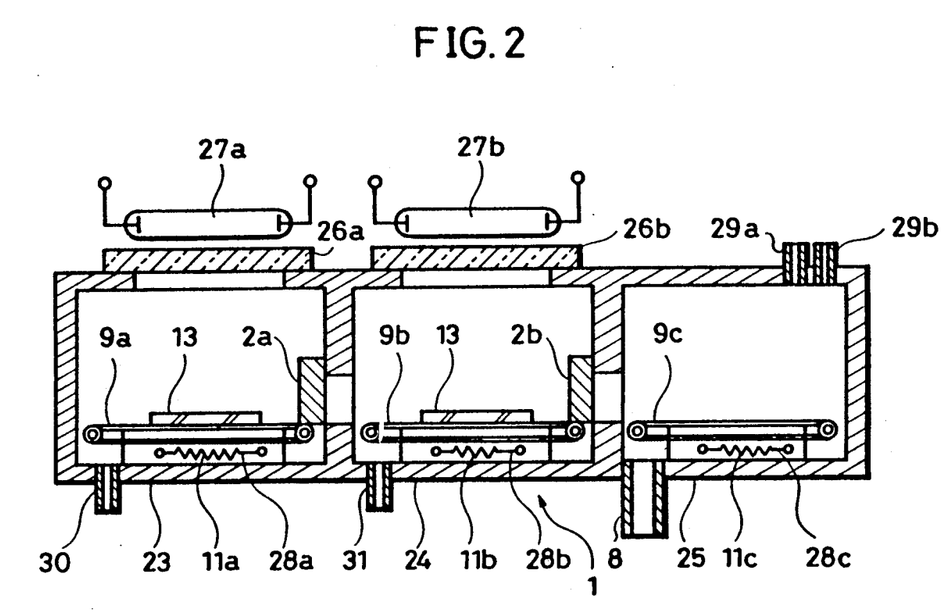
FIG. 2 is a cross-sectional view of an apparatus for forming a thin layer of material according to one preferred embodiment of the invention.

Referring to FIG. 2, there is illustrated a novel apparatus for forming a thin layer on the semiconductor substrate according to one embodiment of the invention.

As shown, the apparatus includes a chamber 1 which is lined with an anti-corrosive material. The chamber 1 is divided into three compartments 23, 24 and 25 by partition walls. The partition walls have formed therein passage openings which are covered with lock valves 2a and 2b, respectively. The first compartment 23 is for forming an oxide layer on a semiconductor substrate and is provided with a gas inlets 30 for introducing oxidizing gas, a belt conveyer 9a for moving the semiconductor substrate, and a window 26a for passing UV rays therethrough. A low-pressure mercury lamp 27a is disposed in facing relations with the UV window 26a. The first compartment 23 also houses a substrate support 11a on which a semiconductor substrate such as silicon substrate 13 is placed. The substrate support 11a is equipped with a heater unit 28a for heating the silicon substrate 13 on the support 11a.

The second compartment 24 is for removing the oxide layer from the semiconductor substrate and is furnished with a gas inlet for introducing a gas effective to etch the oxide layer away, a belt conveyer 9b for moving the silicon substrate, and a window 26b for letting in UV light. Disposed face-to-face to the window 26b is a low-pressure mercury lamp 27b. The second compartment 24 also houses a support 11b on which the silicon substrate is placed. The substrate support 11b is equipped with a heating unit 28b.

The third compartment 25 is for forming a thin layer on the silicon substrate and it is equipped with an exhaust outlet 8 and inlets 29a, 29b for introducing reactive gases. The compartment 25b also houses a conveyer 9c and a substrate support 11c. The substrate support 11c is furnished with a heating unit 28c.

Now the process for forming a thin layer of material on a semiconductor substrate with this apparatus is explained. An untreated silicon substrate is positioned on the support 11a in the first compartment 23 for forming the oxide film. Since the silicon substrate 13 has not been subjected to a solvent cleaning, its surface may be coated with an unwanted layer such as an oxide layer and a metal layer. Or else, the substrate has a damaged surface (as shown in FIG. 1A). After placing the silicon substrate in the first compartment 23, an oxidizing gas such as ozone, $N_2O$ or $NF_3$ is introduced into the compartment through the inlet 30. Then the low-pressure mercury lamp 27a is turned on to radiate UV light into the compartment through the window 26a, and at the same time the heater unit 28a is put into operation to heat the silicon substrate 13 up to a temperature of 300° C., at which temperature organic contaminants that may be present on the substrate surface are dissipated by a chemical oxidation process. The silicon substrate 13 is further heated up to temperatures between 500°–800° C., and a thin oxide layer grows on the substrate surface as a result of photo-chemical reaction. The oxide layer effectively contains an undesired metal layer disposed on the substrate and a damaged substrate surface caused in a preceding step (see FIG. 1B).

After forming the oxide film on the surface of the silicon substrate 13 in the first compartment 23, the lock valve 2a is swung open and both belt conveyers 9a and 9b are put into motion to carry the silicon substrate 13 with the oxide film formed thereon into the second compartment 24 for removing the oxide layer. In the second compartment 24, HCl gas for etching the oxide layer is introduced via the gas inlet 31, and the low-pressure mercury lamp 27b is turned on to direct UV light rays into the compartment 24. Simultaneously, the silicon substrate 13 is heated up to temperatures between 200°–700° C. by the heating unit 28b. Under the conditions, the oxide layer is etched away from the surface of the silicon substrate 13, leaving the cleaned substrate surface (see FIG. 1C).

Is is pointed out when hydrogen gas is used to etch away the oxide layer, the silicon substrate 13 must be heated as high as 1,000°–2,000° C. However, if the UV radiation is jointly employed, the oxide layer on the substrate surface is effectively removed at relatively low temperatures of 500°–800° C. The same is true when chloride gas is used.

Since the undesired metal layer on the substrate surface and the damaged surface layer generated in a preceding etching process have been contained in the thin oxide layer, etching this oxide layer on the silicon substrate assures the removal of those undesirable and damaged layers from the substrate surface, thereby leaving a cleaned substrate surface (FIG. 1C).

The process of forming the oxide layer on the silicon substrate 13 in the first compartment 23 and the process of etching the oxide layer on the substrate 13 in the second compartment 24 which corresponds to the steps represented in FIGS. 1A–1C, are hereinafter referred in combination to as a photo-chemical cleaning process or step.

The next process involves moving the lock valve 2b to its open position, and carrying the photo-chemically cleaned silicon substrate 13 into the third compartment 25 by means of the belt conveyers 9b and 9c. In the third compartment 25 for forming a thin layer of material, the cleaned silicon substrate 13 is placed on the support 11c. After moving the lock valve 2b back to the closed position, the compartment 25 is first exhausted through the outlet 8 and then supplied with a reactive gases for performing chemical vapor deposition through the gas inlets 29a and 29b, while heating semiconductor substrate with the heater unit 28c. Under the circumstances, a thin CVD layer is formed on the surface of the silicon substrate 13. With the organic contaminants, naturally grown oxide layer, metal layer and damaged surface layer all having been etched away from the substrate surface, the newly formed CVD layer involves a well-controlled and well-conditioned interface with the silicon substrate 13 (see FIG. 1D).

The CVD layer may include a mono-crystalline silicon layer epitaxially grown on the silicon substrate, polycrystalline silicon layer and an amorphous silicon layer.

When it is desired to form an epitaxially grown silicon layer on a semiconductor substrate, the desired epitaxial layer is obtained by heating the semiconductor substrate at relatively low temperatures around 600° C. with no oxide film naturally grown at the interface with the substrate. Also, with no unwanted metal layer and damaged surface layer on the semiconductor substrate, the epitaxially grown silicon layer has extremely good crystal grain structure, and thus very low contact resistance.

When it is intended to form a polycrystalline silicon layer on a semiconductor substrate, the absence of a naturally grown oxide film on the substrate surface which otherwise works to increase remarkably the contact resistance, the resulting polysilicon layer exhibits a low contact resistance with respect to the underlying silicon substrate. Thus, the polysilicon layer renders itself an excellent and stable electrical interconnection.

Ultra-thin insulating layers of, for example, oxide silicon, nitride silicon which are suitable for gate insulation and capacitor insulation are successively formed by CVD technique according to the invention with no naturally grown oxide film present at their interface with the substrate surface.

In contrast to a silicon oxide layer formed by controllably oxidizing the silicon substrate at elevated temperatures, the naturally grown oxide film is very fragile, inferior in quality and has low voltage resistant insulation. When the silicon oxide layer and the silicon nitride layer are formed on the silicon substrate according to the invention, there exists no such naturally grown oxide film between the deposited layers and the substrate, which leads to the manufacture of a semiconductor device with much improved insulating characteristics.

Specifically, the silicon nitride layer thus formed exhibit extremely good insulating performance, including di-electric property.

Following the photo-chemical cleaning of the semiconductor substrate, high melting point metals such as tungsten, molybdenum, tantalum and titanium, and the silicide may be chemically vapor-deposited on the cleaned substrate surface.

With no naturally grown oxide film present at the interface with substrate, the chemical vapor deposition of the stated metals and metal silicide produces a semiconductor device having an extremely low contact resistance without performing a heat treatment on the device.

The above-mentioned process for etching the oxide layer is now described in detail based on data obtained by trial experimentations.

It is apparent that the naturally grown oxide film has been removed as a result of the above chemical reaction. However, in order to demonstrate the complete removal of the natural oxide, effective measures have to be worked out since the silicon substrate is so susceptible or prone to oxidation that it is again coated with a natural oxide film almost the moment when taken out of the chamber after the oxide removal treatment. The following unique procedure has been devised to determine whether the spontaneously grown oxide film has been stripped off the silicon substrate. The procedure involves depositing an oxygen-free thin film such a silicon nitride film over the silicon substrate surface after it has been stripped off the natural oxide film, and then observing the element profile of spectrum in the direction of each thickness using Auger electron spectroscopic analysis. With this technique, the presence of oxygen is determined at the interface between the silicon surface (Si) of the substrate and the deposited film of $Si_3N_4$. The presence or absence of oxygen component at the interface indicates whether the spontaneous oxide film has been grown or not at the area.

Figure 3A:
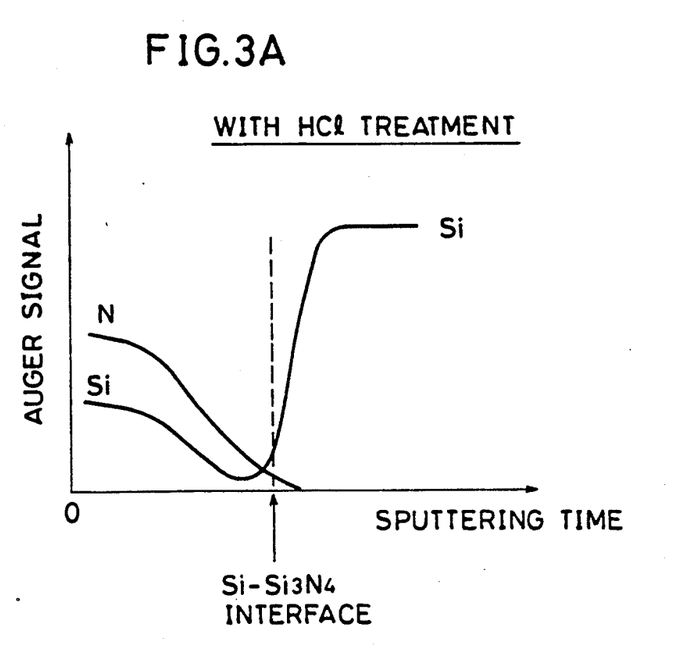
FIGS. 3A and 3B are graphic representations which indicate whether an oxide film formed on a semiconductor substrate is removed or not.

FIG. 3A represents Auger spectrum profiles of a sample silicon substrate taken in the direction of each thickness by the Auger electron spectroscopic analysis, the substrate being coated with a silicon nitride film by chemical vapor deposition or CVD. It is noted that the silicon nitride layer can be formed by means of the apparatus of FIG. 2 using $SiH_2Cl_2$ and $NH_3$ as reaction gases.

In FIG. 3A, the ordinate axis represents the intensity of the Auger signal, while the coordinate axis the sputtering time. It can be seen that with the sample silicon substrate which has been pretreated with HCl gas to remove the oxide film, no Auger signal appeared at or in the neighborhood of the interface between the silicon substrate and the $Si_3NH_4$ film that may indicate the presence of oxygen.

Figure 3B:
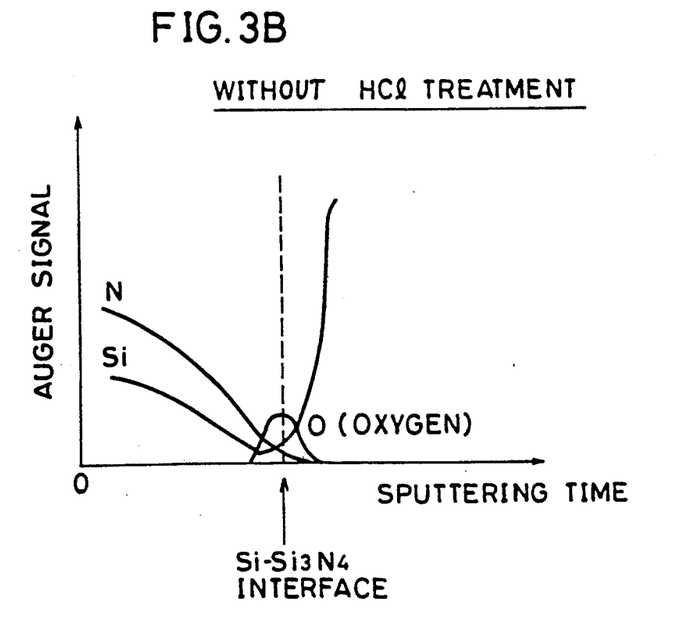

A similar Auger electron spectroscopic analysis was carried out on another sample silicon substrate which had been covered with a coating of silicon nitride ($Si_3N_4$) without previously removing the oxide film. The obtained results are illustrated in FIG. 3B, an Auger signal for oxygen was sensed in the vicinity of the interface between the silicon substrate surface and the silicon nitride coating, which clearly indicates the formation and presence of an oxide film on the substrate surface.

It is apparent from the above that the oxide film is removed from the surface of the silicon substrate without fail if the stated oxide-film removing step is followed.

Figure 4:
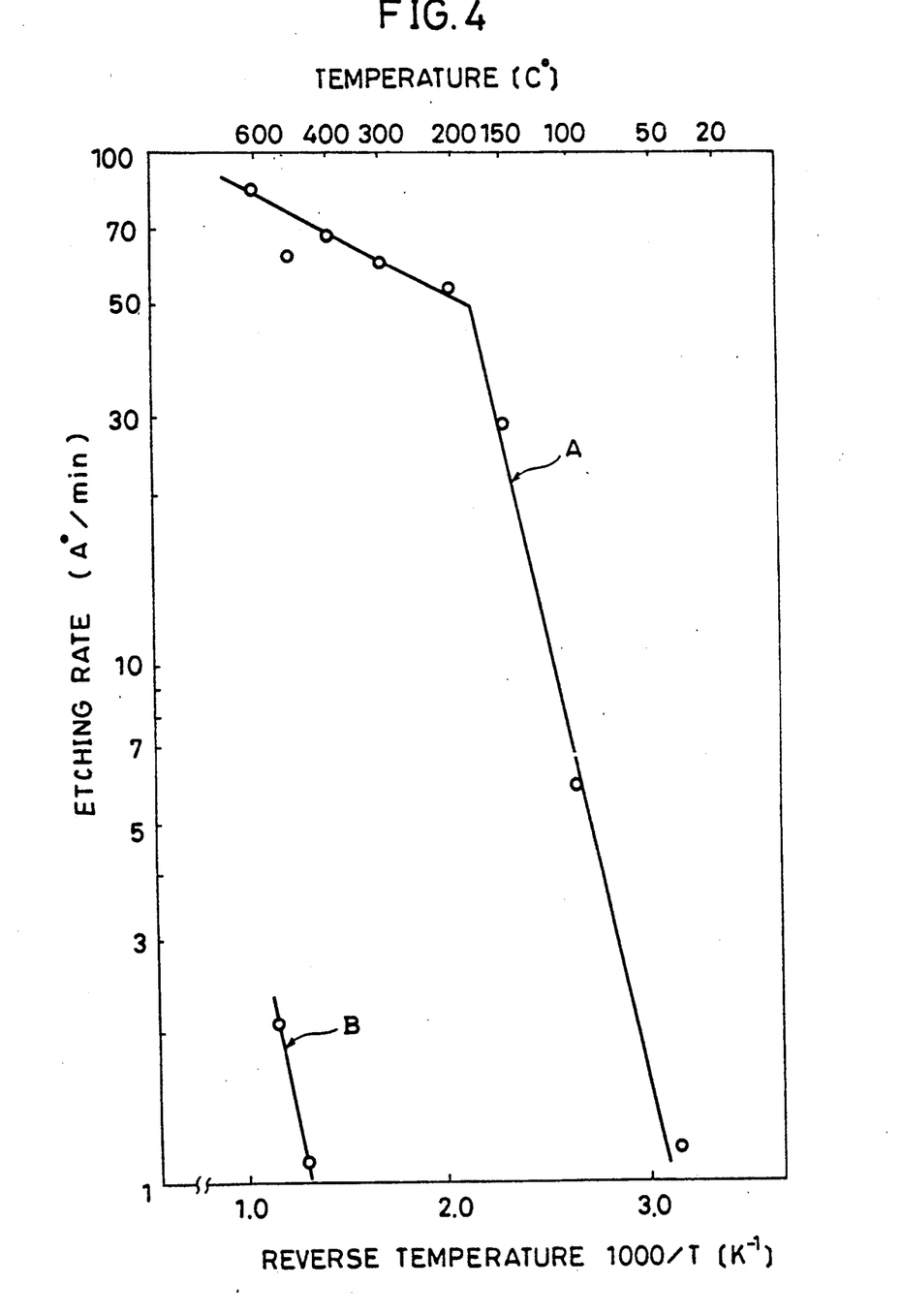
FIG. 4 is an Arhenious plot showing relations between etching rates of a silicon substrate and temperature at which the silicon substrate is heated.
Figure 5A:
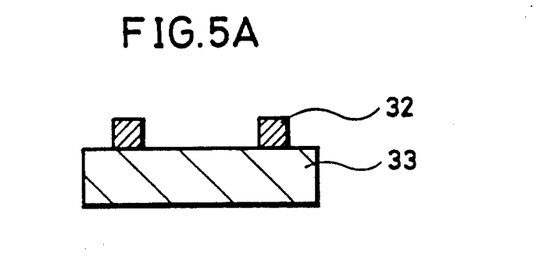
FIGS. 5A-5C are schematic illustrations of a semiconductor substrate showing a procedure for determining the etching rate of a silicon substrate.
Figure 5B:
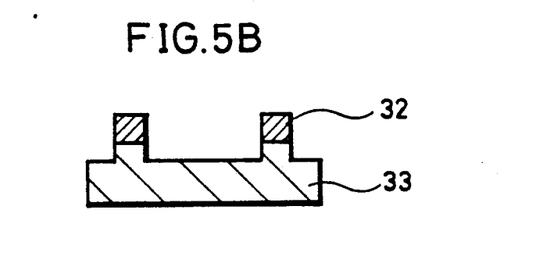
Figure 5C:
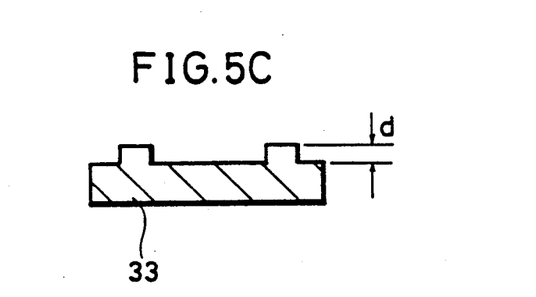

In order to determine desired temperatures at which the silicon substrate is heated to remove the oxide film therefrom, the sample substrates were subjected to dry etching in the presence of hydrogen chloride under exposure rates of the silicon substrates were observed at different temperatures and the observed etching rates were plotted in logarithm against the reverse temperatures 1/T on an Arhenius chart as shown in FIG. 4. It is noted that the rate of the etching on the silicon substrate was determined instead of the naturally grown oxide film since the oxide film is too thin to sense etch removal rate. It is assumed that the etching rate of the silicon substrate suggests the rate at which the oxide film is being removed. Therefore, we try to determine the etching rate of the oxide film based on the observed etching rates of the silicon substrate. Before going on into a detailed discussion of the Arhenius plot of FIG. 4, the procedure used to detect the etching rate of the silicon substrate is first explained with reference to FIGS. 5A-5C. Referring first to FIG. 5A, two P-type silicon substrates 33 having a resistance of 1-100 $\Omega \cdot$cm were prepared and coated with an oxide mask 32. Etching was performed on the coated substrate while supplying 100% HCl gas at 700 sccm and keeping the ambient pressure at 7.2 Torr (FIG. 5B). One substrate was under the radiation of the UV light from a low-pressure mercury lamp during etching, whereas the other was not. After removing the oxide film 32, the etch depth d on the substrate was determined, from which the etching rate was obtainable through calculation (FIG. 5C).

In this manner, etching rate with the sample silicon substrate at various temperatures were obtained with (A) or without (B) the radiation of the UV light. The obtained etching rates were plotted as a function of temperature on the Arhenius chart of FIG. 4.

As can be seen in FIG. 4, under the radiation of the UV light (A), the etching rate gradually increases over the range from room temperature to 200° C. Above 200° C., the etching rate is seen jumping up. The abrupt transition of the etching rate at 200° C. manifests that etching is actually proceeding on the substrate at temperature above 200° C., while below 200° C. no appreciable etching is taking place. FIG. 4 is also shows that the etching rate fails to rise even if the substrate is heated up to as high as 600° C. unless under the radiation of the UV light. In other words, no substantial etching takes place even at elevated temperatures without the UV radiation. The conditions under which the etching of the silicon substrate was observed are similar to those employed for removing the naturally grown oxide film from the silicon substrate. Thus, the findings obtained from the experiment are applicable to the removal rates of the naturally grown oxide film.

Here it is concluded that the naturally grown oxide film of the silicon substrate is effectively stripped off by heating the substrate above 200° C. as well as exposing it to the UV light. As can be seen from FIG. 4, a temperature above 200° C., the higher the temperature, the faster the natural oxide film is removed. However, it is reported that at temperatures above 600° C. amorphous silicon is turned into polysilicon (E. Kinsbron, M. Sternheim and R. K. NOELL, Appl. Phys. Lett., Vol. 42, No. 9,835, May, 1983).

In recent device manufacturing technologies near amorphous state polysilicon with minimum possible grain size is preferred as the substrate material and such substrate is preferably heated at temperatures below 600° C. However, the polysilicon substrate of this type may be heat-treated at temperatures above 600° C. and still shows satisfactory performance and properties as the semiconductor substrate. A heat treatment of the polysilicon substrate at elevated temperatures has an advantage that it can remove the naturally grown oxide film at a faster rate. But care should be taken that the polysilicon substrate is not heated up to temperatures exceeding 700° C. where the above stated advantage is offset by a disadvantage that near amorphous silicon is turned into polysilicon. Accordingly, the semiconductor substrate may preferably be heat-treated at temperatures within the range 200°-700° C.

Figure 6:
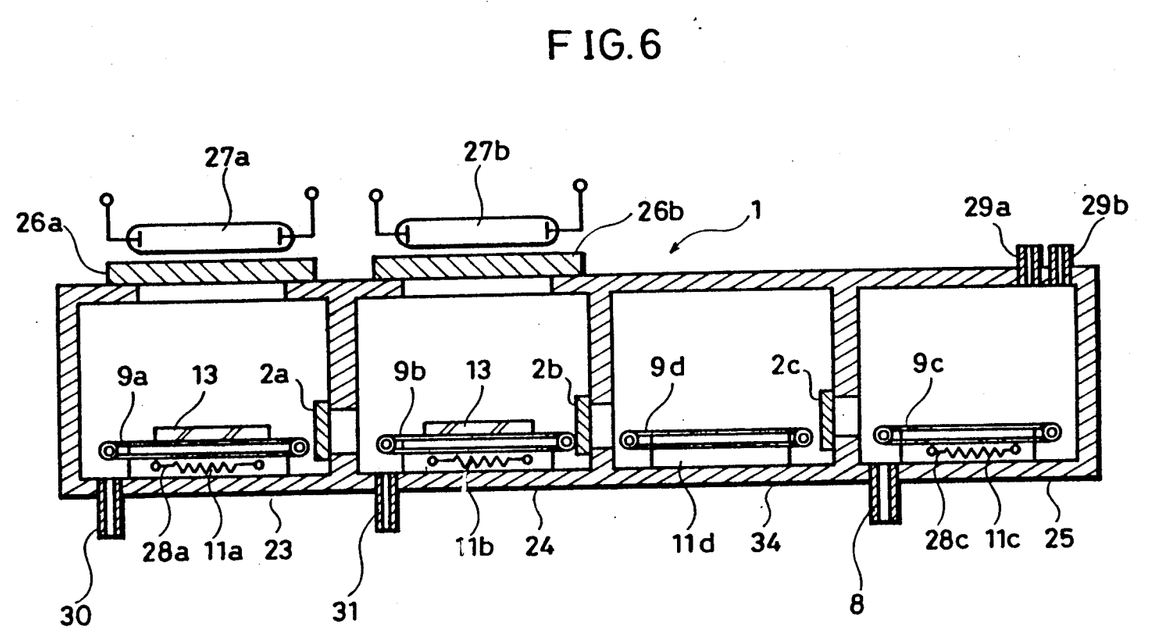
FIG. 6 is a cross-sectional view of an apparatus for forming a thin layer of material on a semiconductor substrate according to another preferred embodiment of the invention.

Referring now to FIG. 6, there is illustrated an apparatus for forming a thin layer of material on a semiconductor substrate according to another preferred embodiment of the invention. The apparatus of FIG. 6 is substantially identical in construction and function to that shown in FIG. 2 except that it is provided with an intermediate compartment 34 auxiliary to the third compartment 25 between the second compartment 24 and the third compartment. Thus, corresponding parts are designated by corresponding reference numerals, giving no further detail description thereof.

As shown, the auxiliary compartment 34 houses a substrate support 11d and a belt conveyer 9d. A silicon substrate 13 which has been stripped of the oxide layer in the second compartment is carried by the conveyer 9b through the passage opening in the partition into the auxiliary compartment 34. For the purpose, of course, the lock valve 2b has to be swung open in an advance. After the belt conveyer 27 in the auxiliary compartment 34 is put into operation and the lock valve 2c is driven open to transport the silicon substrate 13 through the auxiliary compartment 34 into the third compartment 25. As the silicon substrate has been carried into the third compartment, the lock valve 2c is again moved back to the closed position. In this manner, there is very little likelihood that the etching gas in the second compartment 24 is undesirably mixed with the reactive gases in the third compartment 25, eliminating the possibility of the second compartment being polluted with the gases used in the third compartment and vice versa.

Figure 7:
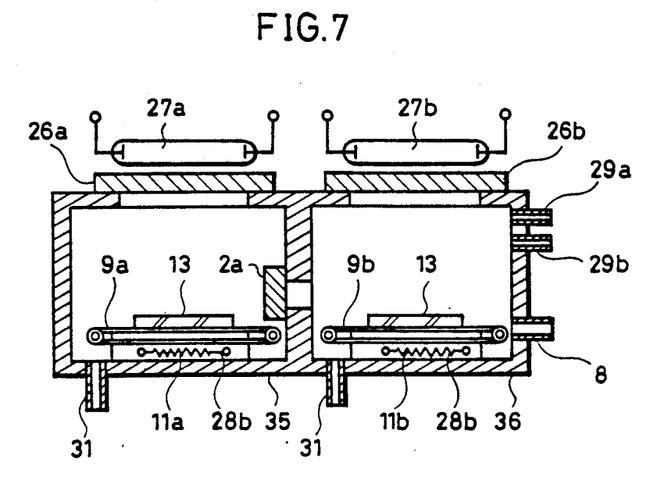
FIG. 7 is a cross-sectional view of an apparatus for forming a thin layer of material on a semiconductor substrate according to still another embodiment of the invention.

In FIG. 7, there is shown an apparatus according to still another embodiment of the invention. The apparatus includes a front compartment 35 and a rear compartment 36. The front compartment 35, being the same in structure as the first compartment 23 in the apparatus of FIG. 2, has its component parts indicated by similar reference numerals, and no detailed description is given here.

The rear compartment 36 is provided with a gas inlet 31 for etching gas, an exhaust outlet 8, and gas inlets 29a and 29b for reactive gases. The rear compartment 36 is also equipped with a conveyer 9b for transporting a semiconductor substrate, and a window 26b for letting in the UV rays. As a source of UV light, a low-pressure mercury lamp 27b is disposed outside the compartment 36 and opposite the window 26b. Housed within the rear compartment 36 is a substrate support 11b for supporting a silicon substrate 13. The support 11b is equipped with a heater unit 28b.

With the apparatus, a thin layer of material is formed on the silicon substrate in the following fashion.

A silicon substrate 13 is first positively coated with an oxide layer as explained in connection to FIG. 2. Then, the lock valve 9a is opened to allow the coated silicon substrate 13 to be transported into the rear compartment 36 by means of the conveyers 9a and 9b. The lock valve 9b is returned to its closed position, and HCl gas for etching the oxide layer is introduced into the compartment 36 through the inlet 31. At the same time, the mercury lamp 27b is turned on to direct the UV radiation into the compartment, which heats the silicon substrate up to temperatures between 200°-700° C. Under the circumstances, the oxide film on the silicon substrate is etched away, leaving a cleaned substrate surface. Upon the removal of the oxide layer, the rear compartment 36 is exhausted by the exhaust outlet 8. The cleaned silicon substrate 13 is again heated by the heater unit 28b, while introducing reactive gases for chemical vapor deposition into the compartment 36 through the inlets 29a and 29b. As a result, a thin CVD layer is formed on the surface of the silicon substrate 13. The apparatus of FIG. 7 is advantageous in that it is very compact in size.

Figure 8:
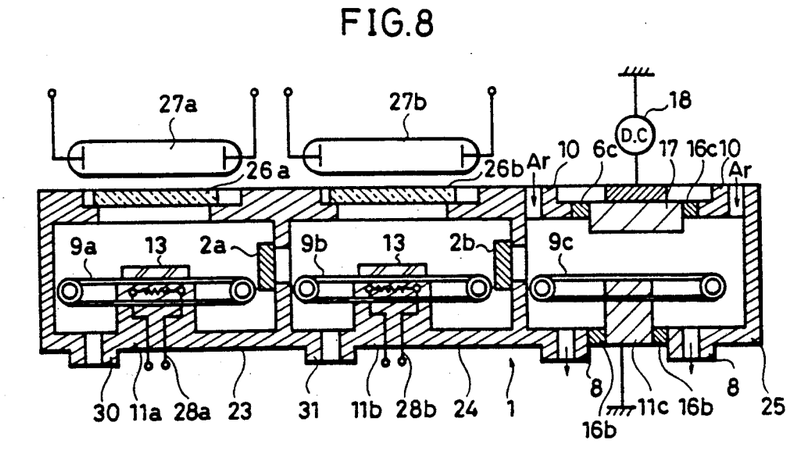
FIG. 8 is a cross-sectional view of an apparatus for forming a thin layer of material on a semiconductor substrate according to still another embodiment of the invention.

An apparatus according to a still another preferred embodiment of the invention is illustrated in FIG. 8. The illustrated apparatus includes a first compartment 23 for forming an oxide layer, a second compartment 24 for etching the oxide layer, and a third compartment 25 for forming a thin CVD layer. Both the first and second compartments 23 and 24 are similar in construction to those in the apparatus of FIG. 2. Thus, corresponding parts are indicated by corresponding reference numerals. A distinctive feature is that the third compartment 25 is designed for sputter-deposition of a thin layer. The compartment 25 has a gas inlet 10 for argon gas, and a exhaust outlet 8 formed in the surrounding wall. The compartment 25 also houses a conveyer 9c, a target 17 and a substrate support 11c. The target 17 is coupled to a DC source 18 for applying a high potential voltage between the target 17 and the argon atmosphere in the compartment. The substrate support 11c is electrically insulated from the compartment by an insulation 16b, while the target 17 by an insulation 16c.

In operation, a silicon substrate 13 has been stripped of an oxide layer on its surface in the second compartment 24. Then, the lock valve is open, and the conveyers 9b and 9c are put into operation to carry the stripped silicon substrate 13 into the third compartment 25. After closing the lock valve 2b, the compartment 25 is exhausted through the outlet 8 by a vacuum pump (not shown) to create a high vacuum state of around $10^{-7}$–$10^{-8}$ Torr. Then argon gas is introduced into the compartment 25 via the inlet 10 at a pressure of $10^{-3}$–$10^{-1}$ Torr, followed by the application of a high potential voltage between several hundred and several thousand volts across the target 17 and the argon gas in the compartment by means of the DC source 18. Consequently, plasma is induced. High high-energy argon ions in the plasma bombard the target 17 which is at a negative potential. Bombarding ions strikes atoms off the target, which are then deposited on the silicon substrate to form a thin suppered layer.

Figure 9A:
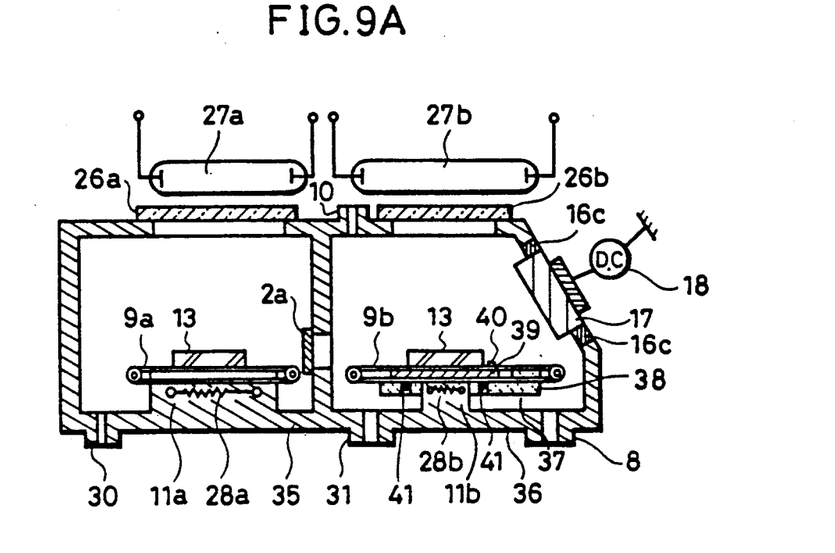
FIGS. 9A and 9B are cross-sectional views of an apparatus for forming a thin layer of material on a semiconductor substrate according to still another embodiment of the invention.
Figure 9B:
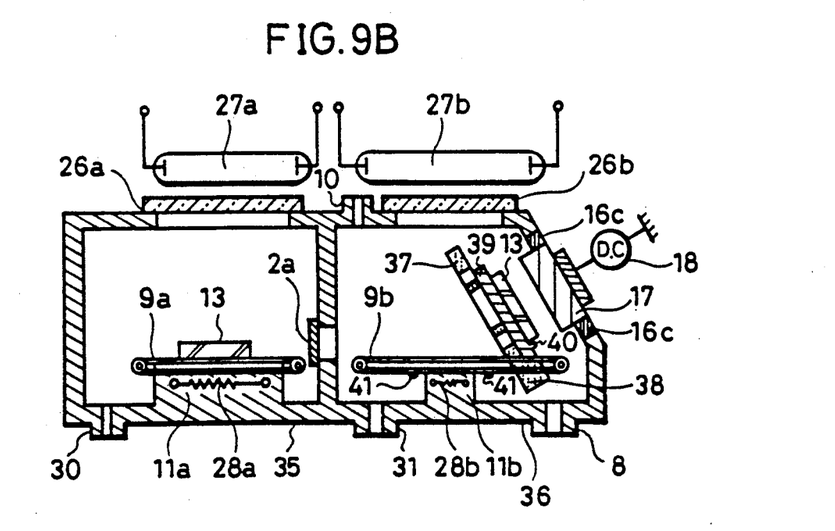

Referring now to FIGS. 9A and 9B, an apparatus according to still another preferred embodiment of the invention is shown. The apparatus includes a front compartment 35 and a rear compartment 36. The front compartment 35 being essentially the same in construction and function as the first compartment 23 in the apparatus of FIG. 2, like parts are indicated by like reference numerals, and no detailed description is given.

The rear compartment 36 is equipped with a gas inlet 31 for oxide etching gas, a gas inlet 10 for argon gas, and an exhaust outlet 8. Provided also in the compartment 36 is a window 26b for letting in the UV light radiated by a low-pressure mercury lamp 27, which is positioned opposite the window 26b outside the compartment. The rear compartment 36 houses a substrate support 11b and a target 17. The substrate support 11b has a heating unit 28b, while the target 17 is coupled to a DC power source 18. An insulation 16 electrically insulate the target 17 from the compartment 36. The rear compartment 36 also has a platen 37 which is supported by a shaft 38 for rotation. A tray 39 for accommodating a silicon substrate 13 is fixedly attached to the rotatable platen 37. The tray 39 has formed thereon a substrate stops 40 in the form of a small projection.

When it is intended to use the rear compartment 36 for etching the oxide layer on a silicon substrate as shown in FIG. 9a, the rotatable platen 37 is held horizontally on support pins 41 with the silicon substrate 13 facing squarely the mercury lamp 27b.

When it is desired to use the rear compartment 36 for forming a thin layer of material on the silicon substrate 13 as shown in FIG. 9B, the platen 37 is rotated on the shaft 38 until the silicon substrate 13 on the tray 39 faces squarely the target 17. In an inclined position of the platen 37, the silicon substrate 13 tends to slide down on the tray 39, but the projection 40 serves to prevent its fall-down.

With the apparatus of FIGS. 9A and 9B, a thin layer of material is formed on a semiconductor substrate as follows. In the front compartment 35, the silicon substrate 13 is coated with an oxide layer as in the apparatus of FIG. 2. The lock valve 2a is swung open, and the silicon substrate 13 with the oxide coating is transferred from the front compartment 35 to the rear compartment 36 by means of the conveyers 9a and 9b. The transfer silicon substrate 13 is placed on the trays 39 on the horizontally held platen 37. With the silicon substrate 13 in facing relations with the low pressure mercury lamp 27, HCl gas is introduced into the compartment 36 through the etching gas inlet 31, followed by the energization of the mercury lamp 27b. The operating mercury lamp 27b radiates UV light through the surface of the silicon substrate 13 through the window 26b. At the same time, the heater unit 28b is put in action to heat the silicon substrate up to temperatures between 200°-700° C. The simultaneous application of heat and light disintegrates and dissipates the oxide layer on the substrate. Upon the completion of etching the oxide layer, the supply of HCl gas and the radiation of the UV light by mercury lamp 27 are discontinued, and the compartment 36 is exhausted of HCl gas to keep in a high vacuum condition.

Figure 10A:
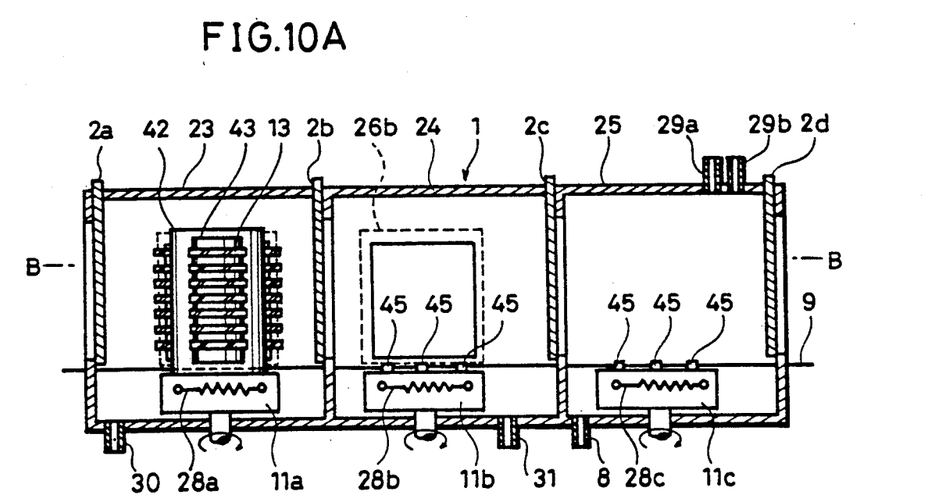
FIGS. 10A and 10B are cross-sectional views of an apparatus for forming a thin layer of material on a semiconductor substrate according to still another embodiment of the invention.
Figure 10B:
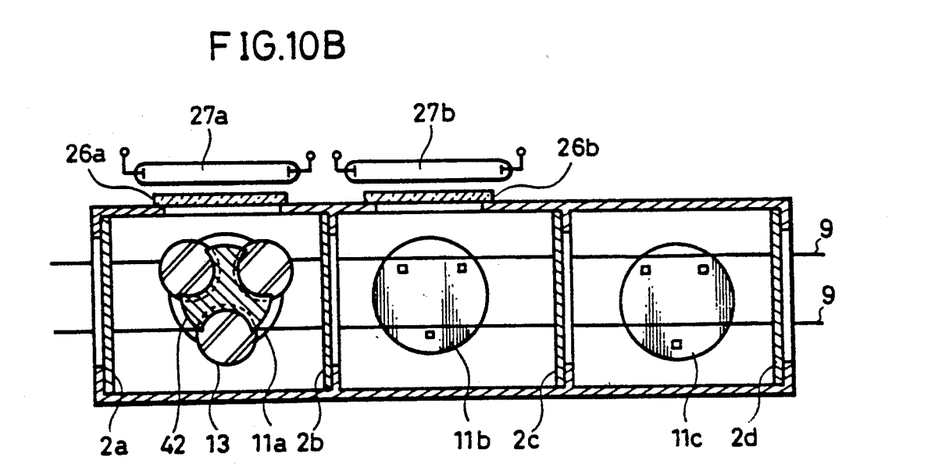

In the next step as shown in FIG. 9B, the platen 37 is rotated upward on the shaft 38 until the silicon substrate 13 on the tray 39 squarely faces the target 17. Under the circumstance, argon gas is introduced into the compartment 36 through the inlet 10, and a high potential is applied across the target 17 and the argon atmosphere thereby to produce plasma in the compartment. The argon ions in the plasma bombard the target 17 with high energies and sputter atoms off the target to be deposited on the silicon substrate 13. A result is a semiconductor device having a thin sputtered layer on a silicon substrate with a well-conditioned interface between them. In FIGS. 10A and 10B, an apparatus according to a still another embodiment of the invention is shown in vertical and horizontal cross-sections.

The illustrated apparatus is particularly suitable for a batch processing of many semiconductor substrates, and includes a chamber 1 which is lined with an anti-corrosive material and is divided by partition walls into a first compartment 23 for forming an oxide layer on a semiconductor substrate; a second compartment 24 for etching away the oxide layer; and a third compartment 25 for forming a thin layer of material. The partition walls are each formed with a passage opening which are closed by shield doors 2b and 2c.

The first compartment 23 is provided with an entrance opening for semiconductor substrate to be processed, which is normally close by a shield door 2a. The first compartment 23 is also equipped with a gas inlet 30 for oxidizing gas and a window 26a for letting in UV light radiated from a low-pressure mercury lamp 27a, which is disposed outside the chamber 1 in facing relations with the window 26a. The first compartment 23 houses a support block 11a, on which a boat 42 for holding a silicon substrate is detachably attached. As shown, the boat is of construction to removably hold a plurality of silicon substrates to be processed. Specifically, the boat 42 is a cylindrical structure with a plurality of vertical grooves 42 formed spaced apart in its peripheral wall. Formed in each of the vertical grooves 43 are a plurality of horizontal slots 43 spaced apart in a vertical direction. The horizontal slot 43 fittingly accommodate the silicon substrate 13. The support block 11a is rotatable on its axis and is equipped with a heating unit 28a.

The second compartment 24 for etching the oxide layer has a gas inlet 31 for an etching gas, and is formed with a window 26b for allowing the UV rays from a low-pressure mercury lamp 27b to pass into the compartment. The mercury lamp 27b is disposed outside the compartment 24 and opposite to the window 26b. The compartment 24 houses a support block 11b, on which the boat 42 is removably attached. For the purpose, male connectors 45 are provided on the upper supporting surface of the support block 11b, and their mating female connectors are formed at the bottom of the boat 42 although they can not be seen in FIG. 10A. As usual the support block 11b has a heating unit 28b and is rotatable on its axis.

The third compartment 25 for forming a thin CVD layer on the silicon substrate is provided with an exhaust outlet 8 and inlets 29a and 29b for reactive CVD gases. The compartment 25 is also formed with an exit opening for process silicon substrates, which is normally closed by a shield door 2d. The compartment 25 houses a support block 11c for detachably supporting the boat 42. For the purpose, the support block 11c has male connectors 45 provided on its top support surface, which fit into the mating female connectors on the bottom of the boat 42.

As a transport mechanism for carrying the boat 42 through the compartments, a pair of retractable transfer rods 9 are provided in the apparatus. In operation, the rods 9 are extended into the chamber 1 below the boat 42, lift up the boat and then move the boat into the desired compartment. When it is intended to rotate the support blocks 11a, 11b and 11c during processing operation, the rods 9 are retracted away from the chamber 1, so that they may not interfere the accompanying rotation of the boat 42.

The method of the invention is performed with the apparatus as follows.

A plurality of silicon substrates are loaded onto the boat 42. The shield door 2a for the entrance opening is open and the boat 42 loaded with the silicon substrate is carried into the first compartment 23 by the transfer rods 9. In the first compartment 23, the boat 42 is fixedly positioned on the support block 11a by means of the mating connectors. The retractable transfer rods 9 are withdrawn out of the chamber, and, while rotating the support block 11a on its axis, an oxidizing gas such as oxygen, and NF$_3$ is supplied into the compartment through the gas inlet 30. Then, the mercury lamp 27a and the heater unit 28 are put into operation, the former radiating UV light into the compartment via the window 26a, the latter heating the silicon substrate up to temperatures between room temperature and 300° C. Under the circumstances, organic contaminants that might be present on the surfaces of the silicon substrates 13 are disintegrated and dissipated by oxidation. The silicon substrates are further heated up to temperatures between 500°-800° C., where a photo-chemical reaction acts to coat the silicon substrates with very thin oxide layers. The oxide layers contain unwanted metal layers on the substrate surfaces or damaged substrate surfaces.

Next step involves opening the shield door 2b and carrying the boat 42 on the transfer rods 9 into the second compartment 24, where the boat 42 is fixedly placed on the support block 11b. After retracting the transfer rods 9 out of the chamber, the support block 11b is started to rotate, and the shield door 2b is closed back. Under the conditions, HCl gas is introduced into the compartment 24 through the inlets 31. Then the mercury lamp 27b and the heater unit 28b are placed into operation. The mercury lamp 27b directs the UV light into the compartment, while the heater unit 28b heats the silicon substrates up to temperatures between 200°-700° C. At the stated elevated temperatures, the thin oxide layers on the substrate surfaces are etched away, leaving the surfaces of the silicon substrate 13 cleaned. After the shield door 2c, the boat 42 is carried over into the third compartment 25 in a similar manner, where it is fixedly position on the support block 11c. The shield door 2c is returned to its closed position, the transfer rods 9 are retracted, and the support block 11c is rotated, followed by exhausting the compartment 25 through the exhaust outlet 8. While heating the silicon substrate 13 on the boat 42 at elevated temperatures, reactive gases for chemical vapor deposition are introduced through gas inlets 29a and 29b, thereby to deposit thin CVD layers on the silicon substrates. With an undesirable components such as organic contaminants, naturally grown oxide layer, metal layers and damaged surface layer having been cleaned of, the CVD layer on the semiconductor substrate 13 has a well-conditioned interface with the substrate surface. The apparatus of FIGS. 10A and 10B are particularly suited to process a large number of silicon substrates.

As has been described in detail, the method according to the invention is effective to remove organic contaminants, unwanted metal layers and damaged surface layer which are present on a semiconductor substrate, and to form a thin layer of material on the substrate surface without exposing it to the surrounding air. The apparatus of the invention is capable of forming a thin layer of material on the surface of a semiconductor substrate without exposing it to the ambient atmosphere successively and right after the substrate surface has been stripped of an oxide layer. Consequently, a semiconductor device with a thin layer of material having improved quality and a well-conditioned interface with the substrate is obtained according to the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for forming a thin layer on a cleaned surface of a semiconductor substrate comprising the steps of:
   growing a thin oxide layer on a surface of a semiconductor substrate by exposing said semiconductor substrate to an oxidizing gas atmosphere while irradiating said surface of said semiconductor substrate with light;
   heating said semiconductor substrate to a temperature of from 200° C. to 700° C. in the presence of an oxide-etching gas while irradiating said surface of said semiconductor substrate with light, to thereby remove said thin oxide layer and provide a cleaned surface on said semiconductor substrate; and
   subsequently forming a thin layer on said cleaned surface of said semiconductor substrate without exposing said semiconductor substrate to ambient air.

2. A method for forming a thin layer of material on a semiconductor substrate according to claim 1, wherein said oxidizing gas is selected from a group consisting of $O_2$, $O_3$, $N_2O$ and $NF_3$.

3. A method for forming a thin layer of material on a semiconductor substrate according to claim 1, wherein said oxide-etching gas is selected from a group consisting of hydrogen chloride gas, chlorine gas, and hydrogen gas.

4. A method for forming a thin layer of material on a semiconductor substrate according to claim 1, wherein said step of forming a thin layer of material on said semiconductor substrate comprises forming said thin layer by means of a chemical vapor deposition technique.

5. A method for forming a thin layer of material on a semiconductor substrate according to claim 1, wherein said step of forming a thin layer of material on said semiconductor substrate comprises sputter-depositing said thin layer.

6. A method for forming a thin layer of material on a semiconductor substrate according to claim 1, wherein said step of removing said oxide layer comprises
   carrying said semiconductor substrate into a first chamber; and
   filling said first chamber with said oxidizing gas, and
   said step of forming said thin layer of material comprises:
   carrying said semiconductor substrate from said first chamber into a second chamber; and
   filling said second chamber with said oxide-etching gas.

7. A method for forming a thin layer of material on a semiconductor substrate according to claim 6, wherein said step of carrying said semiconductor substrate from said first chamber to said second chamber comprises:
   transferring said semiconductor substrate from said first chamber into a third chamber which is provided between said first and second chambers and is controlled to contain no ambient air, and
   transferring said semiconductor substrate from said third chamber into said second chamber.

8. A method for forming a thin layer of material on a semiconductor substrate according to claim 1, wherein
   said step of removing said oxide layer comprises carrying said semiconductor substrate into a chamber and filling said chamber with said oxide-etching gas, and
   said step for forming a thin layer of material comprises replacing said oxide-etching gas within said chamber with a gas suitable for forming said thin layer of material.

9. A method for forming a thin layer of material on a semiconductor substrate according to claim 1, wherein said light source comprises a source of ultra-violet light.

* * * * *